United States Patent
Doyard

(10) Patent No.: US 12,256,524 B2
(45) Date of Patent: Mar. 18, 2025

(54) HEAT SINK FOR A POWER INVERTER OF AN ELECTRIC MOTOR OF A VEHICLE, POWER INVERTER AND VEHICLE

(71) Applicant: Hella GmbH & Co. KGaA, Lippstadt (DE)

(72) Inventor: Etienne Doyard, Toulouse (FR)

(73) Assignee: Hella GmbH & Co. KGaA, Lippstadt (DE)

( * ) Notice: Subject to any disclaimer, the term of this patent is extended or adjusted under 35 U.S.C. 154(b) by 151 days.

(21) Appl. No.: 18/045,319

(22) Filed: Oct. 10, 2022

(65) Prior Publication Data
US 2023/0059477 A1   Feb. 23, 2023

Related U.S. Application Data

(63) Continuation of application No. PCT/EP2020/059998, filed on Apr. 8, 2020.

(51) Int. Cl.
*H05K 7/20* (2006.01)

(52) U.S. Cl.
CPC .................................. *H05K 7/209* (2013.01)

(58) Field of Classification Search
CPC . H05K 7/209; B60L 2210/40; B60Y 2306/05; Y02T 10/72; B60K 1/00
See application file for complete search history.

(56) References Cited

U.S. PATENT DOCUMENTS

| 8,169,780 | B2* | 5/2012 | Yoshino | H05K 7/20927 |
| | | | | 361/689 |
| 10,214,109 | B2* | 2/2019 | Gohara | B60K 1/00 |
| 11,812,592 | B1* | 11/2023 | Inam | H05K 7/20272 |
| 2010/0321889 | A1* | 12/2010 | Yoshino | H05K 7/20927 |
| | | | | 361/702 |
| 2012/0138274 | A1 | 6/2012 | Shin et al. | |
| 2016/0129792 | A1 | 5/2016 | Gohara et al. | |

FOREIGN PATENT DOCUMENTS

| JP | 2004296748 A | | 10/2004 | |
| JP | 2011109740 | * | 2/2011 | ............... H05K 7/20 |
| JP | 2011109740 A | | 6/2011 | |

* cited by examiner

*Primary Examiner* — Anthony M Haughton
*Assistant Examiner* — Hung Q Dang
(74) *Attorney, Agent, or Firm* — Husch Blackwell LLP

(57) ABSTRACT

A heat sink is provided for a power inverter of an electric motor of a vehicle. The heat sink includes a coolant inlet, a coolant outlet, a first cooling segment and a second cooling segment. The heat sink also includes a coolant channel system for cooling one or more power modules A power inverter including the heat sink and a vehicle including the power inverter are also provided.

15 Claims, 3 Drawing Sheets

HEAT SINK FOR A POWER INVERTER OF AN ELECTRIC MOTOR OF A VEHICLE, POWER INVERTER AND VEHICLE

CROSS REFERENCE

This application claims priority to and is a continuation of PCT Application No. PCT/EP2020/059998, filed Apr. 8, 2020, the entirety of which is hereby incorporated by reference.

FIELD OF THE INVENTION

The invention relates to a power inverter for an electric motor of a vehicle, a power inverter and a vehicle, in particular an electric vehicle, having the power inverter.

BACKGROUND OF THE INVENTION

Power inverters, such as known from US 2012/0138274 A1, comprise heat sinks for cooling the power modules of the power inverters. However, it is difficult to achieve uniform cooling performance throughout all power modules of the power inverter. Typically, first power modules are cooled with cold coolant coming from a coolant inlet of the heat sink. The cold coolant becomes heated due to the heat produced by the first power modules. The heated coolant cannot anymore sufficiently cool second power modules arranged after the first power modules with respect to the path of the coolant from the coolant inlet to a coolant outlet of the heat sink. The second power modules will generally be hotter than the first power modules possibly resulting in decreased capability and durability.

BRIEF SUMMARY OF THE INVENTION

Therefore, it is an object of the present invention, to provide a heat sink for a power inverter for an electric motor of a vehicle having improved cooling performance.

Features and details described in connection with the heat sink of the invention apply in connection with the power inverter of the invention and the vehicle of the invention and the other way around, so that regarding the disclosure of the individual aspects of the invention it is or can be referred to one another.

According to a first aspect of the invention, the object is solved by means of a heat sink for a power inverter of an electric motor of a vehicle, the heat sink comprising a coolant inlet, a coolant outlet, a first cooling segment and a second cooling segment, whereby the heat sink comprises a coolant channel system having a first coolant channel directly connecting the coolant inlet with a second coolant channel in the first cooling segment, a third coolant channel directly connecting the second coolant channel with a fourth coolant channel in the second cooling segment, and a fifth coolant channel directly connecting the fourth coolant channel with the coolant outlet, and whereby the heat sink further comprises a first cooling segment and a second cooling segment, the first cooling segment being configured for attachment of at least one first power module of at least two power modules thereto for cooling the at least one first power module by means of the second coolant channel, and the second cooling segment being configured for attachment of at least one second power module of the at least two power modules thereto for cooling the at least one second power module by means of the fourth coolant channel, whereby the heat sink comprises a sixth coolant channel, the sixth coolant channel directly connecting the first coolant channel with the third coolant channel or the fourth coolant channel for cooling the at least one second power module by means of cold coolant from the coolant inlet not having been heated by the at least one first power module via the second coolant channel.

In the third coolant channel or the fourth coolant channel, the coolant coming from the second coolant channel and which has been heated due to the at least one first power module, gets mixed with the cold coolant from the sixth coolant channel. Thereby, compared to not having the sixth coolant channel, the coolant temperature of the coolant in the fourth coolant channel and available for cooling the at least one second power module is significantly lower. This lower coolant temperature enables better cooling performance on the at least one second power module. Thereby, the overall cooling performance is significantly increased by means of the sixth coolant channel supplying the at least one second power module with cold coolant from the coolant inlet.

Each of the coolant channel of the coolant channel system connects together to a coolant channel system from the coolant inlet to the coolant outlet giving path for flow of the coolant therethrough. Thereby, the coolant channels may also be described as segments or parts of the coolant channel system from the coolant inlet to the coolant outlet.

The first cooling segment, the second cooling segment and any further segment mentioned herein may be provided as surface segments on a surface of the heat sink onto which the power modules are attached.

It may be provided that the heat sink comprises an intermediate segment provided in between the first cooling segment and the second cooling segment, the third coolant channel and/or the sixth coolant channel being arranged in the intermediate segment. The intermediate segment may be a neutral segment with regard to cooling, i.e. no power module, in particular no further electric or heating component, being attached thereto. Thereby, in the intermediate segment, there are no heating components heating the intermediate segment and thereby the sixth coolant channel. Thus, the cold coolant in the sixth coolant channel does not get heated and provides for high cooling performance at the at least one second power module.

Further, it may be provided that the first coolant channel splits into the second coolant channel and the sixth coolant channel. The sixth coolant channel may also be described as a coolant channel separating from the first coolant channel connected to the coolant outlet. Thereby, the first coolant channel comprises a coolant channel separation or split into the second coolant channel and the sixth coolant channel. This may be described as a fork, whereby the first coolant channel forks into the second coolant channel and the sixth coolant channel.

Also, it may be provided that the third coolant channel and the sixth coolant channel merge into the fourth coolant channel. This may be described as a fork, whereby the fourth coolant channel forks into the third coolant channel and the sixth coolant channel.

Moreover, it may be provided that the second coolant channel and/or the fourth coolant channel is configured as a subchannel system comprising multiple forks splitting the second coolant channel and/or the fourth coolant channel into multiple subchannels. The coolant flow may be slowed down by means of the multiple forks and subchannels thereby increasing the time of the coolant at the first cooling segment and/or the second cooling segment for cooling the power modules.

Therein, it may be provided that the second coolant channel and/or the fourth coolant channel being configured as the subchannel system spreads over a larger cross-section area of the heat sink than the first coolant channel, third coolant channel, fifth coolant channel and/or the sixth coolant channel. Thereby, the coolant may be provided over a larger surface area at the first cooling segment and the second cooling segment by means of the subchannel system, such that the cooling performance is further enhanced.

Also, therein, it may be provided that the second coolant channel and/or the fourth coolant channel being configured as the subchannel system has a greater flow volume than the first coolant channel, third coolant channel, fifth coolant channel and/or the sixth coolant channel. In other words, the cross-section area of the subchannel system for flow of coolant therethrough is greater. Thereby, more coolant is located in the second coolant channel and/or the fourth coolant channel for enhancing the cooling performance further.

It may be provided that the coolant inlet and the coolant outlet are located at the same side of the heat sink. This enables easy coupling of the coolant inlet and the coolant outlet with a cooling apparatus for providing the coolant in the heat sink, recirculating it through the heat sink and cooling the coolant.

It may further be provided that the sixth coolant channel has a U- or C-shape at its end, the end being directly connected to the fourth coolant channel. Thereby, the direction of the flow of coolant from the sixth coolant channel may be oriented towards the flow direction of the coolant flow through the coolant channel system, i.e. towards the coolant outlet.

Also, it may be provided that the third coolant channel has a U- or C-shape. This enables a compact design of the heat sink for the linkage between the second coolant channel and the fourth coolant channel.

According to a second aspect of the invention, the object is solved by means of a power inverter comprising the heat sink according to the first aspect of the invention, whereby the at least one first power module is arranged at the first cooling segment for cooling the at least one first power module by means of the second coolant channel, and whereby the at least one of the second power module is arranged at the second cooling segment for cooling the at least one second power module by means of the fourth coolant channel.

It may be provided that the at least two power modules are six power modules, wherein three of the six power modules are first power modules and three of the six power modules are second power modules. Six power modules allow for connection to a six-phase electric motor of a vehicle.

It may further be provided that the three first power modules are arranged along a first row in the first cooling segment and the three second power modules are arranged along a second row in the second cooling segment. The first cooling segment may extend along the first row and the second cooling segment may extend along the second row. This allows for easy segmentation into the first cooling segment and the second cooling segment and further for a compact design.

It may additionally be provided that the power inverter is connected to a six-phase electric motor. The power inverter may further be connected to a battery of the vehicle. The battery may be connected to each of the six power modules. Each of the six modules may be connected to one of a phase of the six-phase electric motor.

According to a third aspect of the invention, the object is solved by means of a vehicle, in particular electric vehicle, comprising the power inverter according to the second aspect of the invention. The vehicle may further comprise the battery connected to the six power modules and the six-phase electric motor. Further, the vehicle may comprise the cooling apparatus connected to the heat sink.

Further advantages, features and details of the invention unfold from the following description, in which by reference to drawings FIGS. 1 to 3 working examples of the present invention are described in detail. Thereby, the features from the claims as well as the features mentioned in the description can be essential for the invention as taken alone or in an arbitrary combination.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE DRAWINGS

Figure 1:
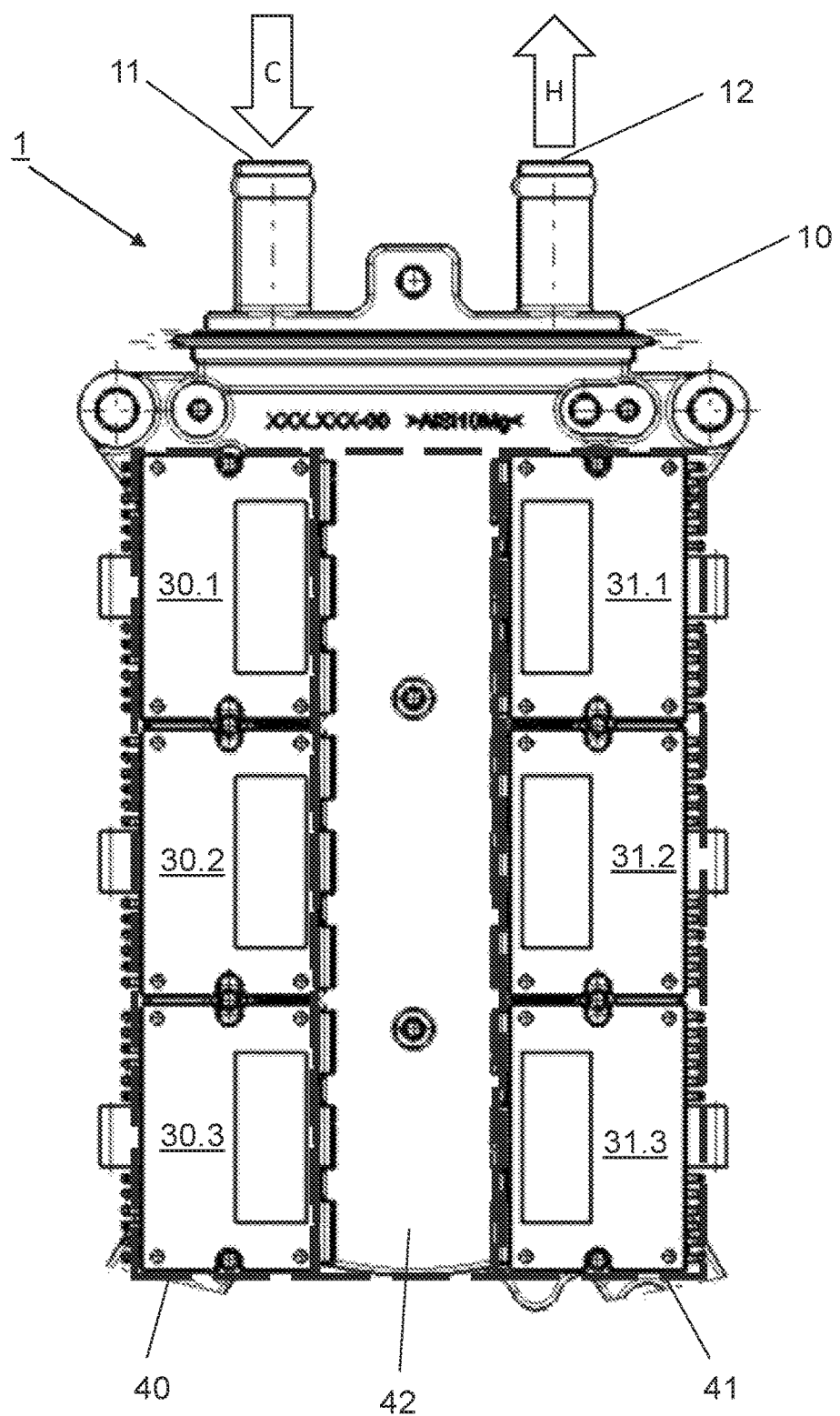
FIG. 1 shows a side view on a power inverter according to an embodiment of the invention.

The power inverter 1 of FIG. 1 comprises a heat sink 10 and six power modules 30.1, 30.2, 30.3, 31.1, 31.2, 31.3. The power inverter 1 is of a DC to AC converter type.

All power modules 30.1, 30.2, 30.3, 31.1, 31.2, 31.3 are attached on one surface of the heat sink 10, which may be flat or substantially flat. The heat sink 10 at that surface comprises a first cooling segment 40, a second cooling segment 41 and an intermediate segment 42. First power modules 30.1, 30.2, 30.3 of the six power modules 30.1, 30.2, 30.3, 31.1, 31.2, 31.3 are attached to the first cooling segment 40, whereas second power modules 31.1, 31.2, 31.3 of the six power modules 30.1, 30.2, 30.3, 31.1, 31.2, 31.3 are attached to the second cooling segment 41. The intermediate segment 42 is in between the first cooling segment 40 and the second cooling segment 41 and there are not power modules 30, 31 attached thereto.

Figure 3:
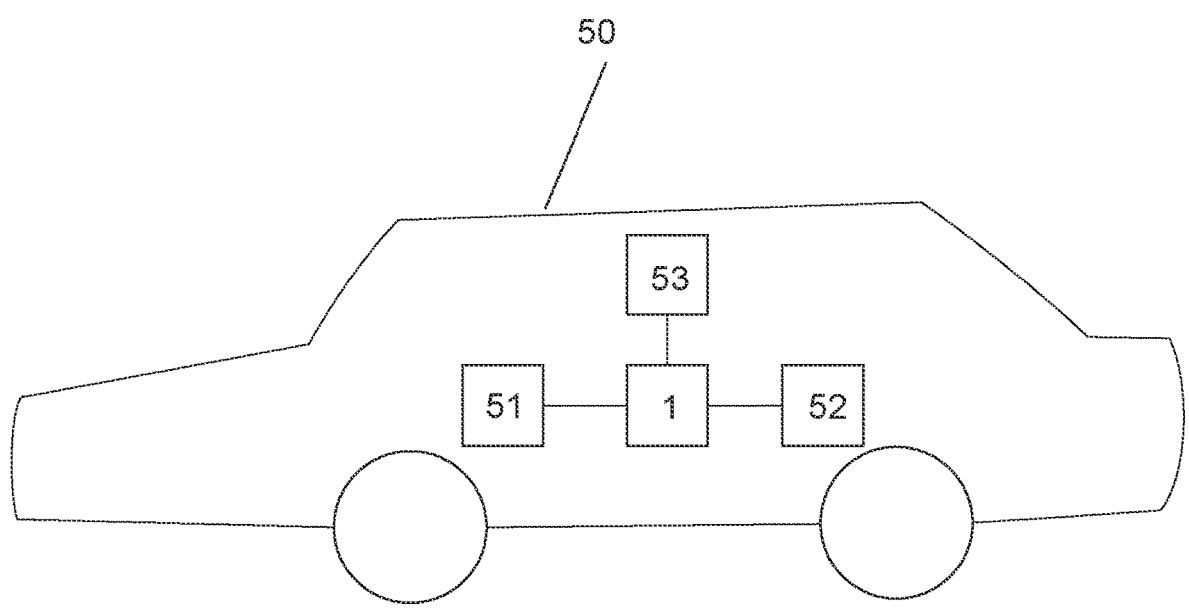
FIG. 3 shows an electric vehicle according to an embodiment of the invention and having the power inverter of FIG. 1.

Thereby, the first power modules 30.1, 30.2, 30.3 differentiate from the second power modules 31.1, 31.2, 31.3 only in their attachment to the first cooling segment 40 and the second cooling segment 41 but are otherwise equally build. Each of these power modules 30.1, 30.2, 30.3, 31.1, 31.2, 31.3 may be connected to one phase of a six-phase electric motor 51 of a vehicle 50, as shown in FIG. 3. Both, the first power modules 30.1, 30.2, 30.3 and the second power modules 31.1, 31.2, 31.3 are arranged in respective rows along the surface of the heat sink 10.

Figure 2:
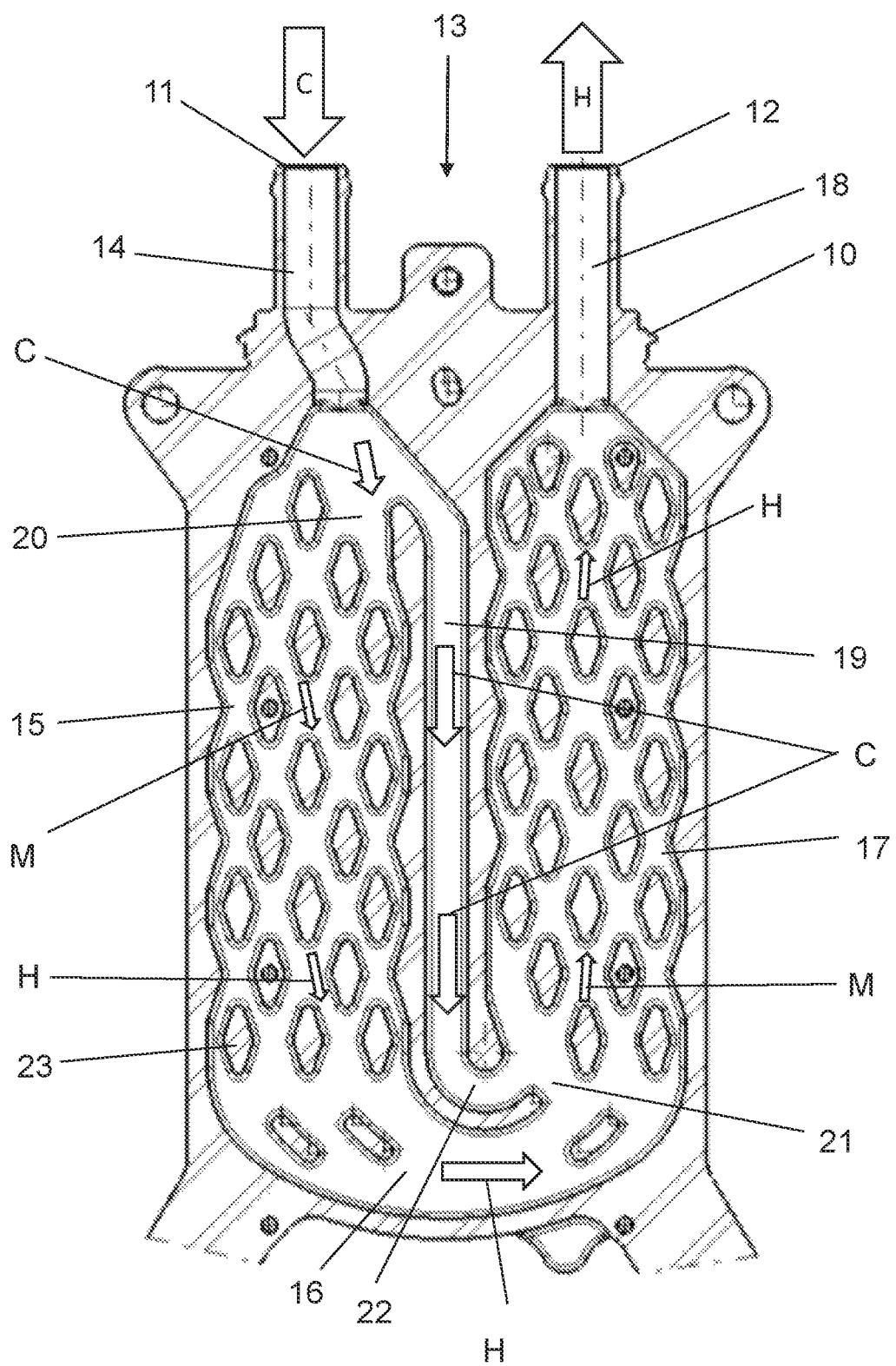
FIG. 2 shows a cross-section view on a heat sink of the power inverter of FIG. 1.

As shown in the cross-section of the heat sink 10 in FIG. 2, the heat sink 10 comprises a coolant channel system connecting a coolant inlet 11 and a coolant outlet 12 connectable to a cooling apparatus 53 (see FIG. 3). Both, the coolant inlet 11 and the coolant outlet 12 are located at the same side 13 of the heat sink 10. Arrows referred to with letters C, M or H indicate the flow of the coolant. Cold coolant, i.e. coolant at low temperature, is referred to with letter C. Coolant at low temperature C enters the coolant inlet 11 and flows through a first coolant channel 14. Hot coolant, i.e. coolant at high temperature, is referred to with letter H. Coolant at high temperature H leaves the coolant outlet 12 coming from a fifth coolant channel 18. Throughout the coolant channel system, the coolant at low temperature C becomes heated due to the heat generated by the power modules 30, 31 and thereby becomes coolant at medium temperature M and afterwards the coolant at high temperature H. The differentiation of the relative coolant temperatures by means of indication with letters C, M and H is only exemplary and for illustration purposes only.

The first coolant channel 14 of the heat sink 10 is directly connected to a second coolant channel 15, which is directly connected to a third coolant channel 16, which is directly connected to a fourth coolant channel 17, which in turn is directly connected to the fifth coolant channel 18 leading to the coolant outlet 13. Each of the coolant channels 14, 15, 16, 17, 18, 19 is located inside of the heat sink 10. Thereby, the coolant flows from the coolant inlet 11 to the coolant outlet 12 through all of the coolant channels 14, 15, 16, 17, 18, 19.

A sixth coolant channel 19 is configured as a bypass coolant channel, which is provided at a first fork 20 splitting the first coolant channel 14 into the second coolant channel 15 and the sixth coolant channel 19. The sixth coolant channel 19 is provided in the intermediate segment 41 and thereby does not get directly heated by any of the power modules 30, 31. Instead, it bypasses the second coolant channel 15 located in the first cooling segment 40, which gets heated up by the first power modules 30.1, 30.2, 30.3. Therefore, the coolant flowing in the sixth coolant channel 19 is at low temperature C, whereas the coolant flowing through the third coolant channel 16, which comes from the second coolant channel 15, is at high temperature H.

The sixth coolant channel 19 merges at a second fork 21 with the third coolant channel 16 into the fourth coolant channel 17 running through the second cooling segment 42, to which the second power modules 31.1, 31.2, 31.3 are attached. Thereby, the coolant at low temperature C from the sixth coolant channel 19 and the coolant at high temperature H from the third coolant channel 16 mix up at the second fork 21 or in the fourth coolant channel 17 and hence coolant at medium temperature M enters the fourth coolant channel 17. This coolant at medium temperature M may still cool the second power modules 31.1, 31.2, 31.3 and provide great cooling performance compared to a solution where there would be no sixth coolant channel 19 and coolant at high temperature H from the third coolant channel 16 would flow through the fourth coolant channel 17.

At its end, the sixth coolant channel 22 comprises a U- or C-shape. This allows for giving the coolant a direction of flow into the flow direction of coolant inside of the fourth coolant channel 17. Further, the third coolant channel 16 comprises a U- or C-shape for linking the second coolant channel 15 with the fourth coolant channel 17.

The second coolant channel 15 and the fourth coolant channel 17 are configured as subchannel systems comprising multiple forks splitting the second coolant channel 15 and the fourth coolant channel 17 into multiple subchannels. The material of the heat sink 10 is provided in a diamond shape 23 in between the second coolant channel 15 and the fourth coolant channel 17 for providing the multiple forks and subchannels. The material of the heat sink 10 in between the second coolant channel 15 and the fourth coolant channel 17 may, however, have different shape such as an oval shape or similar, for example. The second coolant channel 15 and the fourth coolant channel 17 spread over a larger cross-section area of the heat sink 10 and have a greater flow volume than the first coolant channel 14, third coolant channel 16, fifth coolant channel 18 and the sixth coolant channel 19.

The vehicle 50 of FIG. 3, which is an electric vehicle, has the power inverter 1 of FIG. 1. The power inverter 1 is electrically connected to a battery 52, for example a 48 V-battery, and to a six-phase electric motor 51 inside the electric vehicle 50. The heat sink 10 of the power inverter 1 is coupled to a cooling apparatus 53 recirculating cold coolant through the heat sink 10.

REFERENCE SIGN LIST

1 Power inverter
10 Heat sink
11 Coolant inlet
12 Coolant outlet
13 Side
14 First coolant channel
15 Second coolant channel
16 Third coolant channel
17 Fourth coolant channel
18 Fifth coolant channel
19 Sixth coolant channel
20 First fork
21 Second fork
22 End of sixth coolant channel
23 Fork in subchannel system
30 First power module
31 Second power module
40 First cooling segment
41 Second cooling segment
42 Intermediate segment
50 Vehicle
51 Electric motor
52 Battery
53 Cooling apparatus
C Coolant at low temperature
M Coolant at medium temperature
H Coolant at high temperature

The invention claimed is:
1. A heat sink for a power inverter of an electric motor of a vehicle, the heat sink comprising:
 a coolant inlet;
 a coolant outlet;
 a first cooling segment;
 a second cooling segment;
 a coolant channel system having:
  a first coolant channel directly connecting the coolant inlet with a second coolant channel in the first cooling segment,
  a third coolant channel directly connecting the second coolant channel with a fourth coolant channel in the second cooling segment, and
  a fifth coolant channel directly connecting the fourth coolant channel with the coolant outlet;
 the first cooling segment being attached with at least one first power module of at least two power modules for cooling the at least one first power module via the second coolant channel;
 the second cooling segment being attached with a second power module of the at least two power modules for cooling the at least one second power module via the fourth coolant channel;
 a sixth coolant channel which is a bypass coolant channel directly connecting the first coolant channel with at least one of the third coolant channel and the fourth coolant channel for cooling the at least one second power module via cold coolant from the coolant inlet not having been heated by the at least one first power module via the second coolant channel.

2. The heat sink according to claim 1, further including an intermediate segment provided in between the first cooling segment and the second cooling segment, wherein the third coolant channel and/or the sixth coolant channel are arranged in the intermediate segment.

3. The heat sink according to claim 1, wherein the first coolant channel splits into the second coolant channel and the sixth coolant channel.

4. The heat sink according to claim 1, wherein the third coolant channel and the sixth coolant channel merge into the fourth coolant channel.

5. The heat sink according to claim 1, wherein at least one of the second coolant channel and the fourth coolant channel is configured as a subchannel system comprising multiple forks splitting at least one of the second coolant channel and the fourth coolant channel into multiple subchannels.

6. The heat sink according to claim 5, wherein the second coolant channel and/or the fourth coolant channel are configured as the subchannel system spreads over a larger cross-section area of the heat sink than the first coolant channel, third coolant channel, fifth coolant channel and/or the sixth coolant channel.

7. The heat sink according to claim 5, wherein the second coolant channel and/or the fourth coolant channel being configured as the subchannel system has a greater flow volume than the first coolant channel, third coolant channel, fifth coolant channel and/or the sixth coolant channel.

8. The heat sink according to claim 1, wherein the coolant inlet and the coolant outlet are located at the same side of the heat sink.

9. The heat sink according to claim 1, wherein the sixth coolant channel has a U- or C-shape at its end, the end being directly connected to the fourth coolant channel.

10. The heat sink according to claim 1, wherein the third coolant channel has a U- or C-shape.

11. A power inverter comprising the heat sink according to claim 1, wherein the at least one first power module is arranged at the first cooling segment for cooling the at least one first power module via the second coolant channel, and wherein the at least one of the second power module is arranged at the second cooling segment for cooling the at least one second power module via the fourth coolant channel.

12. The power inverter according to claim 11, wherein the at least two power modules are six power modules, wherein three of the six power modules are first power modules and three of the six power modules are second power modules.

13. The power inverter according to claim 12, wherein the three first power modules are arranged along a first row in the first cooling segment and the three second power modules are arranged along a second row in the second cooling segment.

14. The power inverter according to claim 12, wherein the power inverter is connected to a six-phase electric motor.

15. A vehicle comprising the power inverter according to claim 11.

* * * * *